United States Patent [19]
Ohmi et al.

[11] Patent Number: 4,984,060
[45] Date of Patent: Jan. 8, 1991

[54] SEMICONDUCTOR DEVICE WIRINGS WITH HILLOCKS

[75] Inventors: Tadahiro Ohmi, 1-17-301, Komegabukuro 2-chome, Sendai-shi, Miyagi-ken 980; Tadashi Shibata, Miyagi; Masaru Umeda, Tokyo, all of Japan

[73] Assignee: Tadahiro Ohmi, Sendai, Japan

[21] Appl. No.: 359,764

[22] PCT Filed: Sep. 24, 1988

[86] PCT No.: PCT/JP88/00972
§ 371 Date: Jul. 21, 1989
§ 102(e) Date: Jul. 21, 1989

[30] Foreign Application Priority Data

Sep. 24, 1987 [JP] Japan ............................... 62-240332

[51] Int. Cl.⁵ ............................................. H01L 23/48
[52] U.S. Cl. ........................................ 357/68; 357/65; 357/71
[58] Field of Search ............................. 357/71, 68, 65

[56] References Cited

U.S. PATENT DOCUMENTS

| | | | |
|---|---|---|---|
| 4,531,144 | 7/1985 | Holmberg | 357/71 |
| 4,674,176 | 6/1987 | Tuckerman | 357/71 R X |
| 4,734,754 | 3/1988 | Nikawa | 357/68 |
| 4,792,842 | 12/1988 | Honma et al. | 357/68 X |
| 4,884,120 | 11/1989 | Mochizuki et al. | 357/68 |
| 4,887,146 | 12/1989 | Hinode | 357/68 X |

FOREIGN PATENT DOCUMENTS

| | | |
|---|---|---|
| 58-125848 | 7/1983 | Japan . |
| 0059131 | 1/1984 | Japan . |
| 62-160739 | 7/1987 | Japan . |
| 62-160740 | 7/1987 | Japan . |

OTHER PUBLICATIONS

Barson et al., "Hillock Suppression in Aluminum Thin Films", *IBM Technical Disclosure Bulletin*, vol. 13, No. 5, Oct. 1970, p. 1122.

No Author, "Encasing Aluminum Lines in Tungsten to Prevent Al Electromigration in Al-W Interconnect Metallurgies", *IBM Technical Disclosure Bulletin*, vol. 30, No. 5, Oct. 1987, p. 395.

Ho, "General Aspects of Barrier Layers for Very-Large-Scale Integration Applications I: Concepts", *Thin Solid Films*, 96 (1982), 301–316.

*Primary Examiner*—William Mintel
*Attorney, Agent, or Firm*—Jeffers, Hoffman & Niewyk

[57] ABSTRACT

A semiconductor device comprises metal wirings with its minimum line width of 1 μm or less and on the surface of said metal wiring there is no hillock which has its height equal to or more than ¼ of the minimum line width of said metal wiring. The main portion of said metal wiring is formed with pure metal, and is supplied in connection portion between the metal wiring and a semiconductor substrate with a barrier layer for preventing any atoms involved in said metal parts from diffusing into the semiconductor substrate.

2 Claims, 8 Drawing Sheets

dielectric breakdown voltage

SEMICONDUCTOR DEVICE WIRINGS WITH HILLOCKS

BACKGROUND OF THE INVENTION

1. Technical Field:

The present invention relates to a semiconductor device for use in, for example, ultra-high density integrated circuits.

2. Background Art:

In recent years, the degree of integration of Si grows increasingly with large strides to cause earnest research development to make fine sizes of constituent elements ranging from 1 μm to 0.5 μm or less. Along with such developments of elements made in fine sizes and LSIs made ultra-high in integration, metal wires for use in signal transmission in those LSIs are also increasingly required to be made fine and with high density.

Figures 2A, 2B:
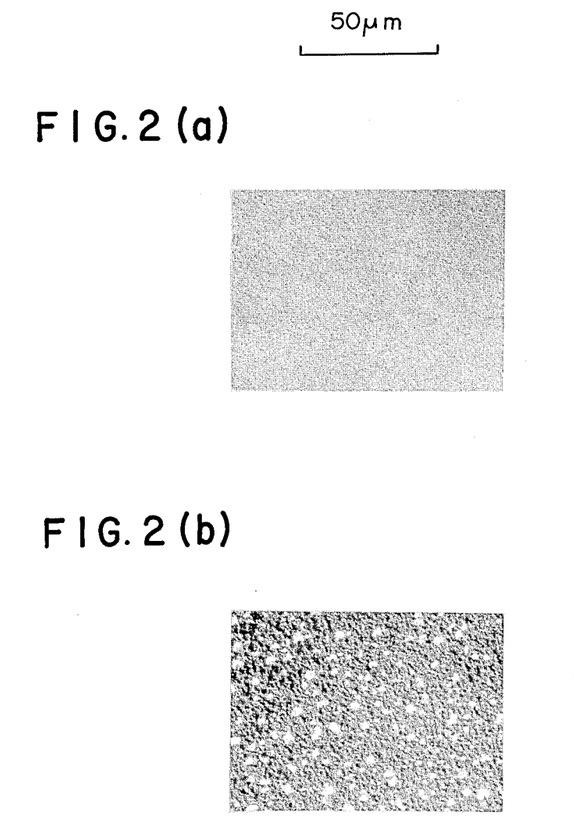
Figure 3A:
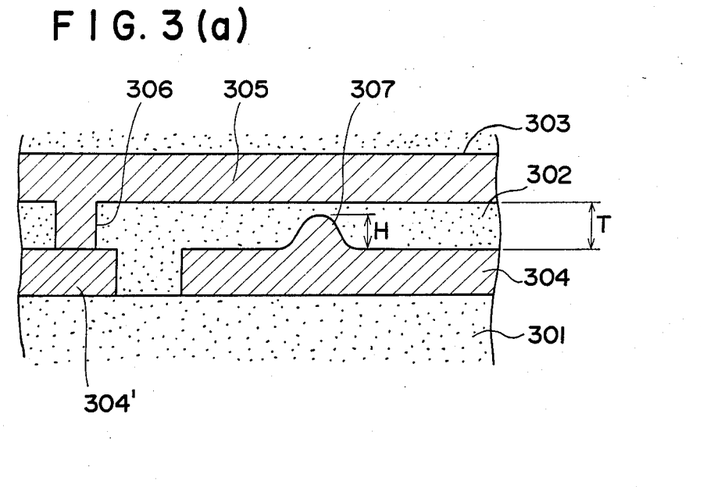
Figure 3B:
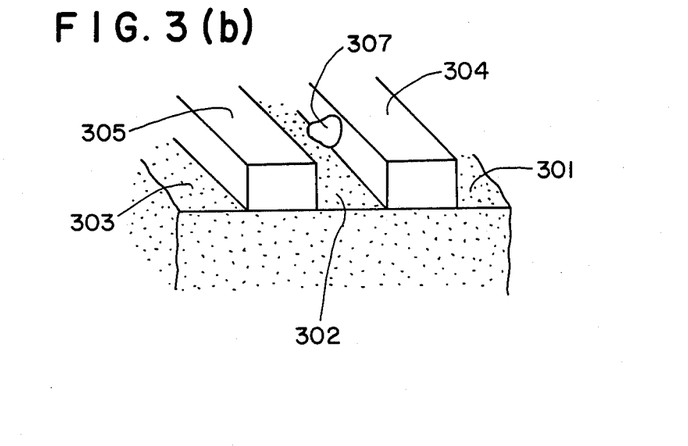

As to metal wire materials for those LSIs, alloys based upon Al such as Al-Si, Al-Cu-Si and the like are widely employed at present. Those materials, however, suffer from diverse problems when wires of those materials are made fine and of high density. FIG. 2 (a) and 2 (b) here illustrate the results of observations of surfaces of Al-Si, which are formed by DC magnetron sputtering widely used conventionally, with use of a Nomarsky differential interference microscope. Films with thickness of about 1 μm are formed by heating a substrate to 250° C. FIG. 2 (a) shows the surface of Al-Si just after the film formation by the DC magnetron sputtering, and FIG. 2 (b) shows the surface of the same after annealing for 30 minutes in forming gas at 400° C. As evidenced by photographs in the figures, the heat treatment causes uneveness on the surfaces of the Al film. These unevennesses are called hillock, the sizes of which range from 0.5 to 1 μm or more. Such hillocks greatly reduce the yield of LSIs for the reason which will be described with reference to FIG. 3.

FIG. 3 (a) is a schematic cross sectional view illustrating a two-layer wiring structure. Numerals 301, 302, and 303 designate insulating films of for example SiO2. Numerals 304 and 304' designate the first-layer Al-Si wiring, and 305 designates the second-layer one, both the wirings being insulated by an interlayer insulating film 302. In addition, the numeral 306 designates a hole made through the interlayer insulating film 302 for electrically connecting the first layer wiring 304' with the second one 305, which hole is called a through hole or via here, and the numeral 307 designates a hillock produced on the upper surface of the first layer wiring 304 where the thickness of the interlayer insulating film 302 is made thinner. This may cause reduced dielectric strength at this portion as compared with other portions where no hillock is produced.

Now, on the assumption that the thickness of the interlayer film 302 at the portions with no hillock is T, the hight of the hillock is H, and the strength of an electric field, by which the interlayer film 302 is rendered to dielectric breakdown, is $E_b$, dielectric breakdown voltage $V_b'$ between the wiring 304 and 305 is expressed by $$V_b' = E_b(T-H) \quad (1)$$

while, dielectric breakdown without the existence of a hillock is expressed by $$V_b = E_b T \quad (2)$$

From (1) and (2), $$V_b'/V_b = 1 - H/T \quad (3)$$

holds. This indicates that the ratio $V_b'/V_b$ becomes very small as the height H of the hillock gets nearer to the thickness T of the interlayer insulating film.

Figure 4A:
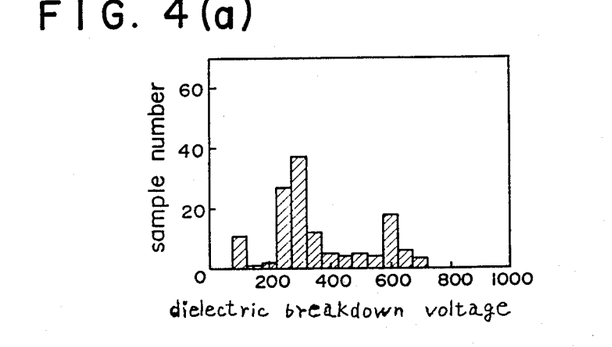
Figure 4B:
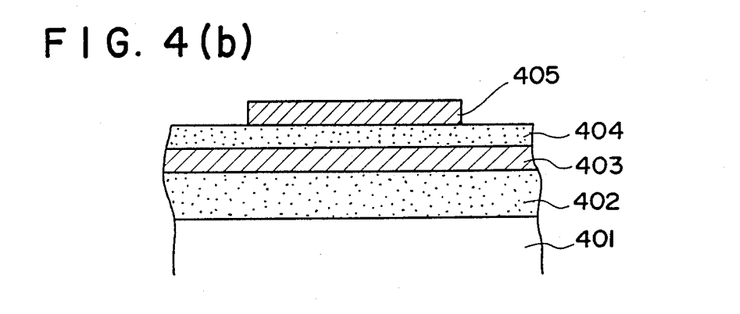

FIG. 4 (a) shows experimental data illustrating the distribution of the breakdown voltages of the interlayer insulating film, and FIG. 4 (b) is a cross sectional view of the measured sample. After the first layer Al-Si film 403 is formed on a silicon substrate 401 via an about 1 μm -thick thermal oxidation film 402, a plasma SiO2 film 404 is deposited by about 1.6 μm over the whole surface thereof. Thereafter, the whole surface is spin-coated by about 1 μm with a resist and cured by baking, and then subjected to anisotropic etching on condition of the resist and SiO2 (404) being etched at the same speed, for the purpose of making the surface flat. Thereupon, the thickness of the plasma SiO2 film 404 at the flattened portion is made 1.2 μm. Thereafter, a second Al-Si film 405 is deposited and patterned into a 200 μm square. Moreover, the first layer Al-Si film 403 is a solid film with no patterning. The dielectric breakdown voltage is measured by applying DC voltage to the upper and lower metal films 405, 403 to thereby determined the voltage of the plasma SiO2 film 404 where it is conducted by its breakdown.

Referring here to FIG. 4(a), the breakdown valtage varies widely from 100V to 700V owing to the distributed heights of the hillocks. The highest hillock falling within the range of a 150 μm square sample is considered to specify the breakdown voltage. The highest breakdown voltage of 700V is now assumed to be one specified when the heights of the hillocks are not so high as to influence the breakdown voltage. That is, this is assumed to be breakdown voltage $V_b$ without the presence of a hillock. Against this, the lowest breakdown voltage of 100V corresponds to the breakdown voltage $V_b'$ at the location of the highest hillock, and $$100/700 = 1 - H/T$$

holds from the equation (3).

On the assumption of T=1.2 μm, H become about 1 μm. From this, the highest hillock is found to be about 1 μm.

Hereupon, the first layer Al-Si film of the sample shown in FIG. 4 (b) estimated just in the above is one formed by raising the wafer temperature upon its deposition to 250° C. and subjecting it to DC-magnetron sputtering. That includes no heat treatment beyond 250° C. after the deposition. That is, the surface is in the same state as the surface shown in FIG. 2(a) with reduced production of the hillocks compared with the sample subjected to the heat treatment at 400° C. (FIG. 2 (b)). The present sample however still suffers from the reduction of the breakdown voltage. So, a number of samples similar to the one shown in FIG. 4 (b) are prepared by rendering the samples, after depositing the first layer Al-Si film 403, to heat treatment at 400° C., and are then subjected to measurements of the breakdown voltage. As a result, almost all the samples exhibit the breakdown voltage of 0V.

As described above, the multi-layer wiring construction reduces the dielectric breakdown voltage of the interlayer insulating film owing to the existence of hillocks. To solve this problem, there is a method of thickening the interlayer insulating film 302. However, this causees film stress to be increased whereby cracks are produced in the film and which result in bad insulation thereof. In addition, such stress enhances a stress migration effect in the metal wiring to thereby shorten the life of the wiring. Thereupon, even if the stress can be sufficiently reduced, a thick film is obliged to have its through hole 306 made deeper to thereby result in difficult fine processing as well as to break the metal wiring at its through hole. This method therefore has many problems.

As described above, the Al-Si film made in the DC magnetron sputtering method suffers from the production of hillocks followed by some problems. Those hillocks are likewise produced in an Al-Cu-Si film, a pure Al film, and the like. There is found no Al-based thin film without such hillocks at present whichever methods such as a RF sputtering method, high-vacuum deposition, CVD, etc, may be employed for its formation. The mechanism of hillock production has not yet been revealed until now and may considered to be due to migration of Al atoms along intercrystalline field. To prevent such migration, some methods have been devised, wherein a high melting point metal such as Ti is introduced into the Al film to thereby suppress the diffusion of Al atoms in the intercrystalline field. These methods are however not only imperfect but also unfavorable to future realization of ultra-high speed LSIs. They are thus not adoptable. The reason is that the key to put high-speed LSIs into practice is to reduce wiring resistance, and although pure metal reduces phonon scattering by lowering its temperature followed by the lowering of its resistance almost in proportion to absolute temperature, wirings made of materials such as alloys and materials involving any impurity permit impurity scattering to dominate at low temperature and thus hinder the effect of the resistance reduction manifested owing to the low temperature.

As the above description shows, the present status of arts can not achieve the wirings without hillocks. That is, there is demonstrated at present very unsatisfactory wiring technology for submicron range ultra-LSIs excellent both in reliability and yield thereof.

SUMMARY OF THE INVENTION

In view of the drawbacks of the prior arts, it is an object of the present invention to provide a semiconductor apparatus capable of preventing any hillock from being produced, the hillock being harmful to the manufacture of submicron LSIs.

A semiconductor apparatus according to the present invention is adapted to include metal wires each having the minimum line width of 1 μm or less, and adapted to prevent any hillock with its height equal to ¼ or more of the minimum line width from being produced on the surface of each of the metal wires.

The present invention is therefore capable of presenting a ultra-high density integrated circuit excellent both in yield and reliability thereof.

BRIEF DESCRIPTION OF DRAWINGS:

FIG. 1 (a) is a schematic block diagram illustrating an apparatus employed in the first embodiment of the present invention;

FIG. 1 (b) is a cross sectional view illustrating a wafer employed in the first embodiment;

FIGS. 1 (c) and 1 (d) are photographs of Al films associated with the first embodiment and taken by a Nomarsky type differential interference microscope;

FIG. 1 (e) is a graph representing the distribution of the dielectric breakdown voltage of Al film samples associated with the first embodiment;

FIG. 2 (a) and 2 (b) are photographs of the prior art Al films taken by a Nomarsky type differential interference microscope;

FIG. 3 (a) and 3 (b) are cross sectional and perspective views illustrating a prior art wiring structure;

FIG. 4 (a) is a graph illustrating the distribution of the dielectric breakdown voltage of prior interlayer insulating film samples;

FIG. 4 (b) is a cross sectional view of a prior art interlayer insulating film sample;

FIGS. 5, 6 (a) and 6 (b) are views illustrating the present invention, wherein

FIG. 7 (a) and 7 (b) are views respectively illustrating measured results of temperature dependencies of resistance of Al film formed on (a) Si (b) $SiO_2$ by a DC-RF coupling bias sputtering method; and FIG. 8 (a), 8 (b) and 8 (c) are cross sectional views illustrating the wiring structure associated with a second embodiment.

DESCRIPTION OF THE PREFERRED EMBODIMENT

The numerals 105, 111, 801 are silicon substrates; 106, 403, 405 are Al films; 304, 305, 601, 804, are Al wirings; 805 is barrier metal.

BEST MODE FOR CARRYING OUT THE INVENTION

The first embodiment of a semiconductor apparatus according to the present invention will be described with reference to FIGS. 1 (a) to 1 (e).

FIG. 1 (a) illustrates a bias sputtering apparatus of a combined DC-RF system which has already been applied by the present inventor (Japanese patent application No. 61-131188).

Figure 1A:
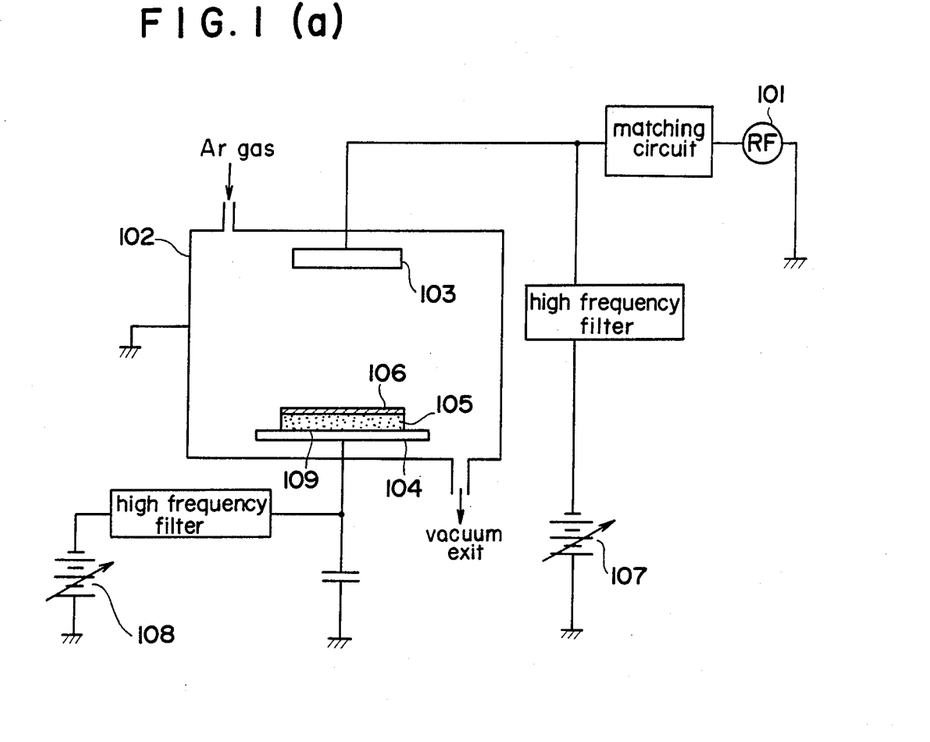
Figure 1B:
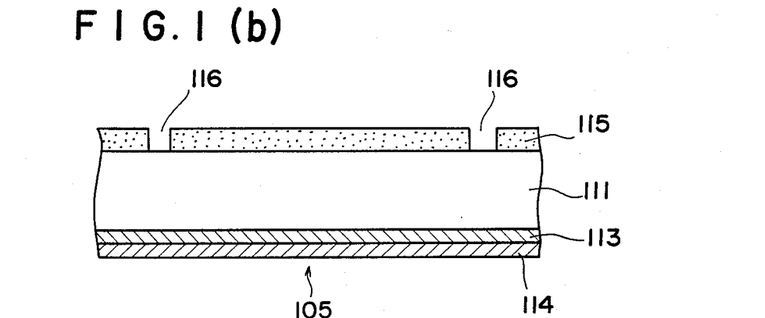
Figure 1C:
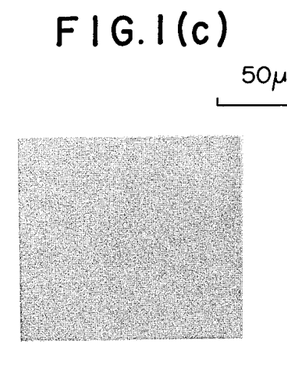

The bias sputtering apparatus is adapted to effectively render Ar gas introduced in chamber 102 to electrical discharge by making use of an 100 MHZ radio-frequency power source 101 to produce $Ar^+$ ions and thereby bombard an Al target 103 with the produced $Ar^+$ ions for sputtering the target. Al atoms flying out of the target owing to the sputtering are allowed to arrive at and be adsorbed by the surface of a silicon wafer 105 disposed on a wafer holder 104 for the growth of an Al film 106. A target potential can be set to an arbitrary value by a DC power source 107. In fact, the target 103 can be sputtered effectively by setting the target potential to a range of from 500 to 1000V. In addition, a wafer holder potential can also be set by DC power source 108. The surface of the growing Al film 106 can be bombarded by setting the wafer holder potential to a proper negative value. Moreover, this bias sputtering apparatus is described in detail in Japanese patent application No. 61-131188 and The Technical Report issued from the Japanese Electrocommunication Association, Vol. 86 No. 138, SSD 86~55.

The present bias sputtering apparatus is capable of precisely controlling, as its feature, the formation process of the Al film externally by the RF power source 101 and the two DC power sources 107 and 108. That is, the RF power specifies the density of the Ar ions in the plasma, while the DC power sources control the energy of the Ar+ ions with which the target and the wafer are respectively bombarded. The present apparatus is therefore capable of setting the formation speed of the Al film on the wafer as well as the energy of the ions with which the Ar surface during the film formation is bombarded and the total amount of the energy, respectively and independently.

FIG. 1 (b) is a cross sectional view of the wafer employed in the present embodiment, wherein only a main portion thereof associated with the formation of the metal wiring is depicted. The numeral 111 designates a n type silicon wafer with its specific resistance of for example from 5 to 10$\Omega$ cm. An n+ layer 113 with n type impurity concentration of for example $1 \times 10^{19}$ cm$^{-3}$ or more is formed on the back of the n type silion wafer 111, and a tungsten silicide layer (WSi$_2$) 114 with its thickness of for example about 0.05 to 1 $\mu$m is formed on the surface of the same. In addition, a SiO$_2$ film 115 with its thickness of about 1 $\mu$m is provided on the surface of the same. An opening 116 indicates a scribe line of the wafer, where the sputtered Al and the silicon substrate make contact with each other to keep the electric potential of the Al film equal to that of the substrate silicon. Moreover, the wafer potential is controllable from the wafer holder via the silicide layer 114.

The wafer so constructed is fixedly mounted on the wafer holder 104 of the bias sputtering apparatus shown in FIG. 1 (a) to form the Al film. The wafer holder employed here is a wafer susceptor of electrostatic attraction according to the invention of the present inventor, the susceptor being capable of arbitrary control of the wafer potential (Wafer Susceptor Apparatus, Japanese patent application No. 60-265912).

The conditions to form the Al film are selected as follows. The rate of formation of the film is for example 5000Å/min, and the energy of the Ar ions with which the Al surface is irradiated during the film formation is 40 eV. Additionally, the irradiation amount of the Ar ions is determined by adjusting the DC power supplies 107 and 108 and the RF power supply 101 such to assure that every one of the deposited Al atoms is irradiated with six to eight Ar atoms. Moreover, the film thickness is about 1.2 $\mu$m and the temperature of the wafer holder upon the film formation is about 100° C.

Here, FIG. 1 (c) and (d) illustrate photographs of surfaces of Al films prepared under the conditions described above, the photographs being taken by a Nomalsky differential interference microscope. FIG. 1 (c) is the surface of the Al film immediately after the preparation thereof, while FIG. 1 (d) is the like surface but after the heat treatment at 400° C., showing that a very flat surface without formation of any hillock can be obtained even after the heat treatment. Additionally, these photographs teach us that the surface of the Al film immediately after the preparation thereof is also more excellent in its flatness than that in the surface of a film of Al-Si prepared by the prior technique (FIG. 2 (a)).

The same structure as that shown in FIG. 4(b) is prepared for the Al film described above and the distribution of dielectric voltage of this structure is measured experimentally. The result is shown in FIG. 1(e). As shown in the figure, 90% or more of all samples demonstrate the dielectric voltage of 700 V. Although there are found several % of the samples with the dielectric voltage of 656 V, this is not due to any hillock but due to local thinned portions produced in interlayer insulating film, which resulted in deterioration of the dielectric voltage of about 50 V. The result is substantially the same independently of whether any heat treatment is done or not.

The coupled DC-RF bias sputtering apparatus according to the invention of the present inventor assures as described above the formation of hillock-free pure Al wiring even with the heat treatment by controlling the rate of the film formation and the energy and irradiation amount of Ar ions with which the Al surface is irradiated.

The formation of ultra-high density LSI wiring using such Al wiring enjoys the realization of submicron LSIs excellent in reliability and yields without deterioration of the dielectric voltage of the interlayer insulating film because of no appearance of any hillock independently of whether the heat treatment is done or not.

Figure 5:
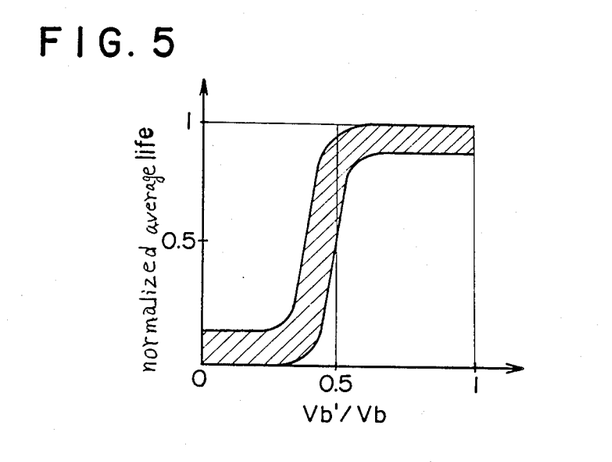
FIG. 5 is a graph illustrating a relation between $V_b'/V_b$ and an average life, and FIGS. 6 (a) and 6 (b) are a cross sectional views illustrating a wiring structure.

Any hillock, although desired to be zero, may be existent provided the size thereof is so sufficiently small as not to affect badly the reliability of the associated element. The following is an experiment about what size the hillocks may be existent. A sample with the same capacitor structure as that shown in FIG. 4(b) is employed, which has its upper electrode 405 sized 1 cm square. The voltage of 50 V, sufficiently lower than the dielectric strength, is applied between the two electrodes 405,403 at temperature of 100° C. for effecting acceleration testing. Hereby, many of such samples were measured for their average lives to breakdown thereof. It was thus found that the sample with the electrode 405 sized 200 $\mu$m square, which has their distribution of the dielectric strength varying more widely, suffer from the shorter average life. This means the reliability of the layered insulating film is specified at a location of the presence of the highest hillock. Now, the ratio $V_b'/V_b$ of lowest value $V_b'$ in the distribution of the dielectric strength to the highest one $V_b$ will be assumed as a parameter indicative of the scatter of the dielectric strength. For example, the distribution in FIG. 4(a) has $V_b'/V_b = 1/7$ with $V_b'/V_b = 0.93$ in the distribution of FIG. 1(e). The result of this experiment teaches us that there is a semiquantitative relationship between the average life and the ratio $V_b'/V_b$ of the layered insulating film. That is, it is found that the average life is substantially constant when the ratio $V_b'/V_b$ is 0.5 or more, while it is rapidly reduced around the ratio $V_b'/V_b$ of from 0.4 to 0.5 and further deteriorated by one digit or more as compared with the sample having the ratio $V_b'/V_b$ 0.5 when the ratio $V_b'/V_b$ is 0.4 or less. FIG. 5 illustrates this relationship qualitatively. In the figure, the ordinates indicative of the average life is normalized by that of a sample of $V_b'/V_b \approx 1$. Substantially the same relationship holds also when the conditions of the acceleration testing such as the applied voltage and temperature are changed. Although the cause of this situation is not yet clear, it is conjectured that the so-called time dependent breakdown of the layered insulating film is promoted owing to the concentration of an electric field at locations in the layered insulating film where large-sized hillocks are existent.

For the purpose, accordingly, of keeping the reliability of the layered insulating film high enough, it is necessary on any account to satisfy the condition $V_b'/V_b > \frac{1}{2}$. That is, the following relation is required from the equation (3):

$$H/T < \tfrac{1}{2} \qquad (4)$$

Figure 6A:
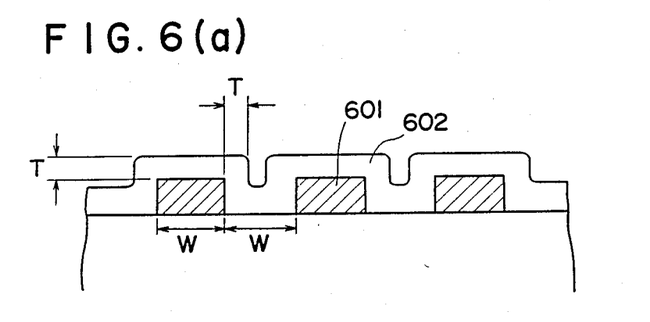

FIG. 6(a) is a sectional view of a wiring structure where metal wirings 601, each having a width of W and with the interval between each other of W, are coated thereon with an interlayer insulating film 602 with its thickness of T. The structure must satisfy a relation $T \geq W/2$ in order to permit regions among those metal wirings to be insulated completely. That is, the thickness T must be w/2 or more. Inserting this value W/2 into (4), $$H/W < \tfrac{1}{4} \qquad (5)$$

holds. This teaches us that the height of any hillock must be lower than ¼ of the minimum line width of the metal wiring.

Figure 6B:
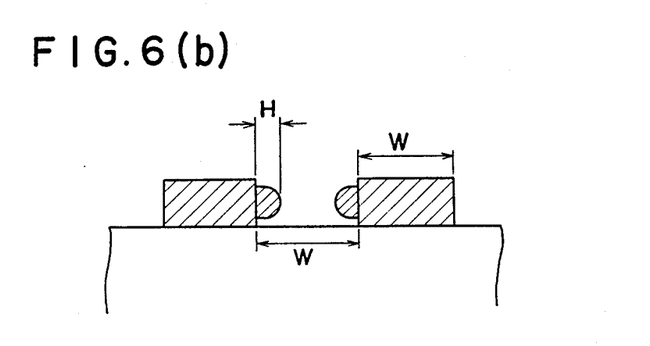
Figure 7A:
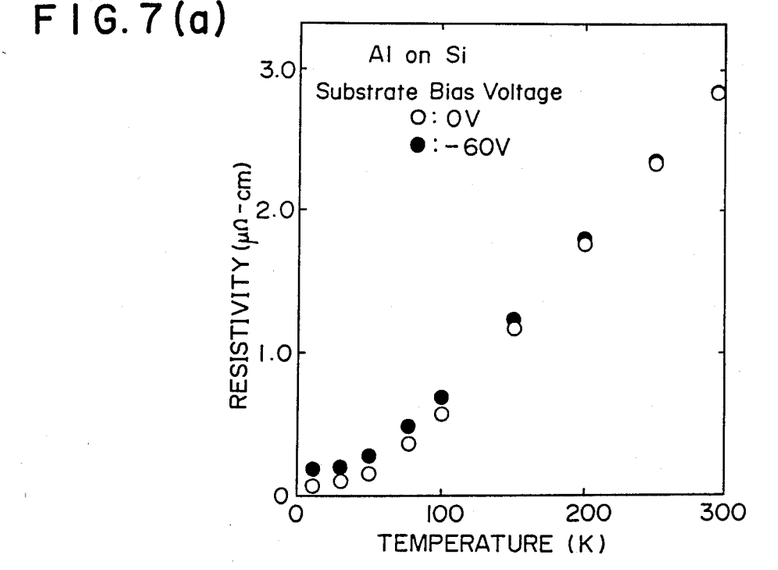
Figure 7B:
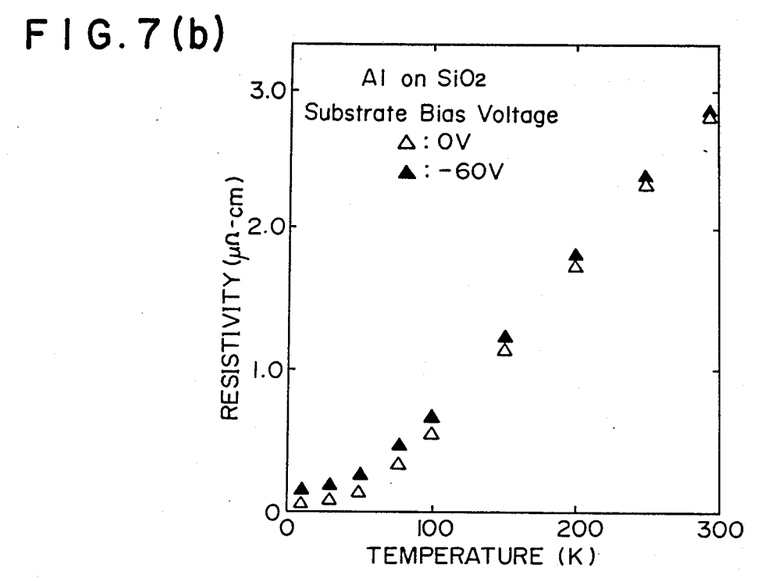

FIG. 6(b) illustrates a situation of the wiring structure wherein two adjoining metal wiring have respectively hillocks at the same portions thereof. A ratio of the dielectric strength $V_b'$ in the situation mantioned above to $V_b$ of adjoining metal wiring without any hillock is expressed by:

$$V_b'/V_b = (W - 2H)/W \qquad (6)$$

The ratio $V_b'/V_b$ must be larger than ½ since the same relation as that shown in FIG. 5 is considered to hold in view of the reliability of the interlayer insulating film among the metal wirings. Inserting this value ½ into (6), a relation:

$$H/W < \tfrac{1}{4} \qquad (7)$$

holds.

It is thus found from the consideration described above that the wiring structure wherein the height H of any hillock is less than ¼ of the minimum line width of the involved metal wiring is substantially not deteriorated compared with the like structures without any hillock in view of the reliabilities of the insulating film located between the upper and lower metal wirings and between the adjoining metal. In other words, the essential conditions to form any high reliability LSI wiring may be ensured by preventing any hillock with its height larger than ¼ of the minimum line width of the wiring from being produced on the metal wiring surface of an LSI.

Figure 1D:
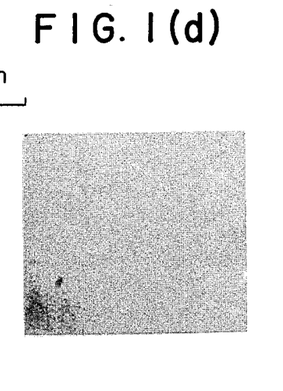
Figure 1E:
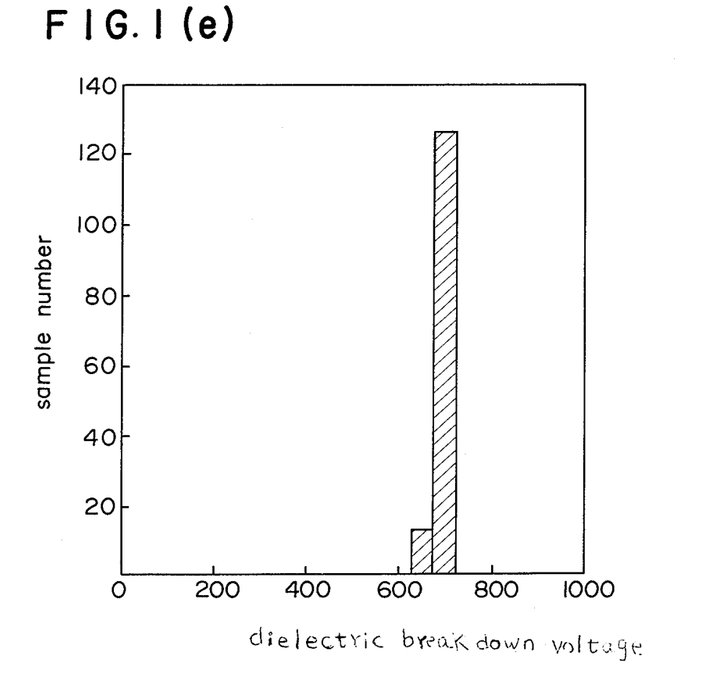

As clearly shown in the first embodiment of the present invention, an Al film without any hillock can be formed by making use of the combined DC-RF bias sputtering technique (FIG. 1(d)). It is accordingly made possible to form a wiring with high reliability also for LSIs in conformity with design ruling less than 1.0 μm. Additionally, resistance of a pure Al film formed by this technique is 2.8 μΩcm, a small value, substantially equal to that of a bulk resistor. Moreover, that resistance is lowered to about 1/10 thereof by refrigerating it to the temperature of liquid nitrogen. This is very advantageous for high speed operation.

Figure 8A:
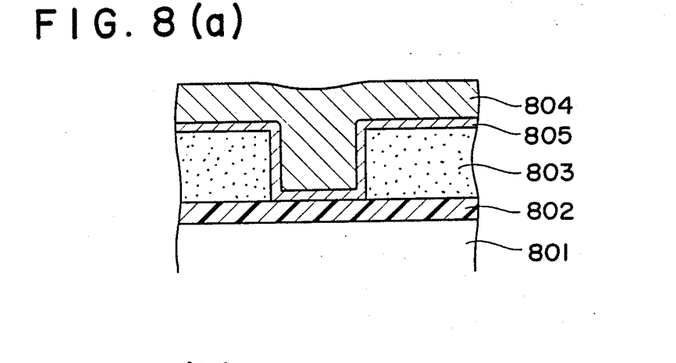

FIG. 8 is a sectional view of a wiring structure of the second embodiment of the present invention, illustrating the structure of a contact hole. The numeral 801 is a p type silicon substrated, 802 is a n+ diffusion layer, 803 is an insulating film, and 804 is a hillock-free pure Al film formed by using the bias sputtering apparatus of FIG. 1(a).

Additionally, the numeral 805 is barrier metal composed of w(tungsten) with thickness of about 500 Å for prevening the so-called Al spikes from being produced, the Al spike short-circuitting the n+ layer 802 by permitting Al atoms to diffuse into the substrate Si (801) due to the heating processes.

Figure 8B:
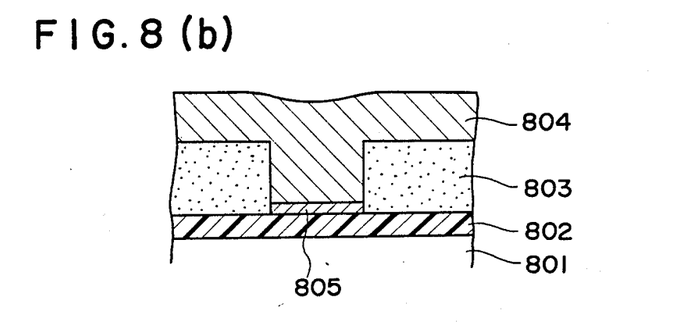
Figure 8C:
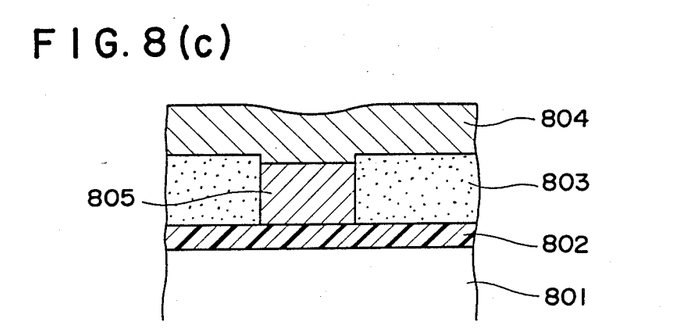

Such barrier metal does not diffuse into the Al 804 to form any alloy, and does not allow the resistance of the Al to be increased at low temperature owing to alloy scattering. Although the barrier metal in FIG. 8(a) is provided over the whole lower surface of the Al wiring 804, this may be provided for example only around the contact hole, as illustrated in FIG. 8(b). In addition, it may be formed in such a way that the contact hole is filled therewith, as illustrated in FIG. 8 (c).

Furthermore, for the barrier metal, any material including Tin, beside w, may be employed, or no such material may be employed. The pure film in the present embodiment assures a stable interface between Al and Si even against the heat treatment at about 500° C. without production of any spike.

Although the embodiments of the present invention were described only with respect to the pure Al film wiring, the same effect of the invention will be obtained also for film of any other metal such for example as Cu, W, Mo, Ti, Au, Ag, and the like. More specifically, any alloy material may be employed as a matter of course provided a phenomenon of resistance due to low temperature is not needed.

INDUSTRIAL APPLICABILITY

A semiconductor device comprises metal wirings with its minimum line width of 1 μm or less and on the surface of said metal wiring there is no hillock which has its height equal to or more than ¼ of the minimum line width of said metal wiring.

We claim:

1. A semiconductor device comprising metal wirings, said metal wirings including hillocks on the surfaces thereof, said metal wirings having minimum line widths of 1 μm or less and an interlayer insulating film disposed over said metal wirings, wherein the relationship between the minimum line width W of said metal wirings, the thickness T of said interlayer insulating film, and the height H of said hillocks is expressed by:

$$H/T \leq \tfrac{1}{2}$$

$$H/W \leq \tfrac{1}{4}.$$

2. A semiconductor device according to claim 1 wherein said metal wirings are substantially composed of pure metal.

* * * * *